(12) United States Patent
Hshieh

(10) Patent No.: US 7,109,110 B2
(45) Date of Patent: Sep. 19, 2006

(54) METHOD OF MANUFACTURING A SUPERJUNCTION DEVICE

(75) Inventor: Fwu-Iuan Hshieh, Saratoga, CA (US)

(73) Assignee: Third Dimension (3D) Semiconductor, Inc., Tempe, AZ (US)

( * ) Notice: Subject to any disclaimer, the term of this patent is extended or adjusted under 35 U.S.C. 154(b) by 0 days.

(21) Appl. No.: 11/015,519

(22) Filed: Dec. 17, 2004

(65) Prior Publication Data

US 2005/0181577 A1    Aug. 18, 2005

Related U.S. Application Data

(60) Provisional application No. 60/531,465, filed on Dec. 19, 2003.

(51) Int. Cl.
H01L 29/06    (2006.01)

(52) U.S. Cl. ............................. 438/653; 257/E21.023; 257/E21.231; 257/E21.572; 488/184; 716/19

(58) Field of Classification Search ............... 257/359, 257/E21.023, E21.231, E21.572, 653; 438/164, 438/184; 716/19
See application file for complete search history.

(56) References Cited

U.S. PATENT DOCUMENTS

| | | | |
|---|---|---|---|
| 4,158,206 A | 6/1979 | Neilson | |
| 4,866,004 A * | 9/1989 | Fukushima | ............... 438/432 |
| 4,895,810 A | 1/1990 | Meyer et al. | |
| 5,019,522 A | 5/1991 | Meyer et al. | |
| 5,045,903 A | 9/1991 | Meyer et al. | |
| 5,216,275 A | 6/1993 | Chen | |
| 5,366,914 A | 11/1994 | Takahashi et al. | |
| 5,435,888 A | 7/1995 | Kalnitsky et al. | |
| 5,472,888 A | 12/1995 | Kinzer | |
| 5,506,421 A | 4/1996 | Palmour | |
| 5,598,018 A | 1/1997 | Lidow et al. | |
| 5,742,087 A | 4/1998 | Lidow et al. | |
| 5,744,994 A | 4/1998 | Williams | |
| 5,786,619 A | 7/1998 | Kinzer | |
| 5,902,127 A | 5/1999 | Park | |
| 5,929,690 A | 7/1999 | Williams | |
| 5,939,754 A | 8/1999 | Hoshi | |
| 6,081,009 A | 6/2000 | Neilson | |
| 6,184,555 B1 | 2/2001 | Tihanyi et al. | |
| 6,190,970 B1 | 2/2001 | Liao et al. | |
| 6,198,127 B1 | 3/2001 | Kocon | |
| 6,214,698 B1 | 4/2001 | Liaw et al. | |
| 6,222,229 B1 | 4/2001 | Herbert et al. | |

(Continued)

*Primary Examiner*—Matthew Smith
*Assistant Examiner*—Jarrett J. Stark
(74) *Attorney, Agent, or Firm*—Aktin Gump Strauss Hauer & Feld, LLP

(57) ABSTRACT

A partially manufactured semiconductor device includes a semiconductor substrate. The device includes a first oxide layer formed on the substrate, with a mask placed over the oxide-covered substrate, a plurality of first trenches and at least one second trench etched through the oxide layer forming mesas. The at least one second trench is deeper and wider than each of the first trenches. The device includes a second oxide layer that is disposed over an area of mesas and the plurality of first trenches. The device includes a layer of masking material that is deposited over a an area of an edge termination region adjacent to an active region. The area of mesas and first trenches not covered by the masking layer is etched to remove the oxidant seal. The device includes an overhang area that is formed by a wet process etch.

5 Claims, 6 Drawing Sheets

U.S. PATENT DOCUMENTS

| | | |
|---|---|---|
| 6,239,463 B1 | 5/2001 | Williams et al. |
| 6,265,281 B1 | 7/2001 | Reinberg |
| 6,291,856 B1 | 9/2001 | Miyasaka et al. |
| 6,300,171 B1 | 10/2001 | Frisina |
| 6,307,246 B1 | 10/2001 | Nitta et al. |
| 6,359,309 B1 | 3/2002 | Liao et al. |
| 6,362,505 B1 | 3/2002 | Tihanyi |
| 6,391,723 B1 | 5/2002 | Frisina |
| 6,410,958 B1 | 6/2002 | Usi et al. |
| 6,452,230 B1 | 9/2002 | Boden, Jr. |
| 6,459,124 B1 | 10/2002 | Zhang et al. |
| 6,465,325 B1 | 10/2002 | Ridley et al. |
| 6,495,421 B1 | 12/2002 | Luo |
| 6,501,130 B1 | 12/2002 | Disney |
| 6,501,146 B1 | 12/2002 | Harada |
| 6,504,230 B1 | 1/2003 | Deboy et al. |
| 6,509,220 B1 | 1/2003 | Disney |
| 6,635,906 B1 | 10/2003 | Chen |
| 2002/0070418 A1 | 6/2002 | Kinzer et al. |

* cited by examiner

METHOD OF MANUFACTURING A SUPERJUNCTION DEVICE

CROSS-REFERENCE TO RELATED APPLICATIONS

This application claims priority to U.S. Provisional Application No. 60/531,465, filed Dec. 19, 2003, entitled "Methods of Manufacturing a Superjunction Device."

BACKGROUND OF THE INVENTION

The present invention relates to a method for manufacturing a semiconductor device utilizing overhangs to block ion implantation of the bottom of deep and wide trenches at the device edge terminations, enhancing the voltage blocking capability of the device terminations. The overhangs are created by non-comformally depositing thick oxide to seal the top of each trench in a selected area, thereby allowing the deposition of photoresist, nitride or polysilicon to form the overhangs without the material going into the trenches. The resulting semiconductor device is a metal-oxide semiconductor (MOS)-gated power device suitable for power switching, having both a low on-resistance $R_{ON}$ and a high breakdown voltage $V_b$.

Since the invention of superjunction devices by Dr. Xingbi Chen, as disclosed in U.S. Pat. No. 5,216,275, there have been many attempts to expand and improve on the superjunction effect of his invention. U.S. Pat. Nos. 6,410,958, 6,300,171 and 6,307,246 are examples of such efforts and are incorporated herein by reference.

U.S. Pat. No. 6,410,958 ("Usui, et al.") relates to an edge termination structure and a drift region for a semiconductor component. A semiconductor body of the one conductivity type has an edge area with a plurality of regions of the other conductivity type embedded in at least two mutually different planes. Underneath the active zone of the semiconductor component, the drift regions are connected using the underlying substrate.

U.S. Pat. No. 6,307,246 ("Nitta, et al.") discloses a semiconductor component having a high-voltage sustaining edge structure in which a multiplicity of parallel-connected individual components are disposed in a multiplicity of cells of a cell array. In an edge region, the semiconductor component has cells with shaded source zone regions. During commutation of the power semiconductor component, the shaded source zone regions suppress the switching "on" of a parasitic bipolar transistor caused by the disproportionately large reverse flow current density. Moreover, an edge structure having shaded source zone regions can be produced very easily in technological terms that are discussed in the Nitta, et al. patent. It clarifies the effects of parameters and enables the mass production of a superjunction semiconductor device which has a drift layer composed of a parallel PN layer that conducts electricity in the "on" state and is depleted in the "off" state. The net quantity of active impurities in the N-type drift regions is within the range of 100% to 150% of the net quantity of active impurities in the p-type partition regions. In addition, the width of either one of the N-type drift regions and the p-type partition regions is within the range between 94% and 106% of the width of the other regions.

U.S. Pat. No. 6,300,171 ("Frisina") discloses a method for manufacturing an edge structure for a high voltage semiconductor device, including a first step of forming a first semiconductor layer of a first conductivity type, a second step of forming a first mask over the top surface of the first semiconductor layer, a third step of removing portions of the first mask in order to form at least one opening in it, a fourth step of introducing dopant of a second conductivity type in the first semiconductor layer through the at least one opening, a fifth step of completely removing the first mask and of forming a second semiconductor layer of the first conductivity type over the first semiconductor layer, a sixth step of diffusing the dopant implanted in the first semiconductor layer in order to form a doped region of the second conductivity type in the first and second semiconductor layers. The second step up to the sixth step are repeated at least one time in order to form a final edge structure including a number of superimposed semiconductor layers of the first conductivity type and at least two columns of doped regions of the second conductivity type, the columns being inserted in the number of superimposed semiconductor layers and formed by superimposition of the doped regions subsequently implanted through the mask openings, the columns near the high voltage semiconductor device being deeper than the columns farther from the high voltage semiconductor device.

It is desirable to provide a semiconductor device with an enhanced voltage blocking edge termination, in which the bottom of the deep and wide trench at the termination is not ion implanted, and includes a thick oxide region. It is also desirable to provide such a device that is manufactured using a technique compatible with a process using only a single epitaxial deposition step in the manufacture of the device.

BRIEF SUMMARY OF THE INVENTION

Briefly stated, the present invention comprises a partially manufactured semiconductor device including a semiconductor substrate having first and second main surfaces opposite to each other. The semiconductor substrate has a heavily doped region of a first conductivity type at the second main surface and has a lightly doped region of the first conductivity type at the first main surface. The device further includes a first oxide layer formed over the first main surface, with a mask placed over the oxide-covered substrate, a plurality of first trenches and at least one second trench being etched through the oxide layer into the semiconductor substrate through openings in the mask forming mesas. Each first trench has a first extending portion extending from the first main surface toward the heavily doped region to a first depth position, the at least one second trench having a second extending portion extending from the first main surface toward the heavily doped region to a second depth position. Each mesa has a sidewall surface with a predetermined inclination maintained relative to the first main surface, and each of the plurality first trenches and the at least one second trench are separated from adjacent trenches by one of the mesas. The at least one second trench is deeper and wider than each of the plurality of first trenches. The partially manufactured semiconductor device includes a second oxide layer that is disposed over an area of mesas and the plurality of first trenches. The second oxide layer covering the top of each mesa and sealing the top of each of the plurality of first trenches and the at least one second trench at an edge of the area containing the mesas and the plurality of first trenches. The partially manufactured semiconductor device includes a layer of masking material selected from a group including a photoresist, a nitride, a metal, and polysilicon, that is deposited over a preselected area of an edge termination region adjacent to an active region containing at least the area of mesas and the plurality of first trenches and partially over the at least one second trench at an edge of the area of the active region containing the mesas and the plurality of first trenches. The edge termination region contains a portion of the at least one second trench. The active region is the area on which semiconductor devices will be formed and the termination region is an area which provides insulation between cells of active devices. The area of mesas and the plurality of first trenches not covered by the masking layer is etched using a dry process oxide etch to remove the oxidant seal over the plurality of trenches including the at least one second trench. The partially manufactured semiconductor device includes an overhang area that includes the masking material and that is formed by a wet process etch which removes areas of the oxide layer not protected by the masking material. The overhang area extending partially over the at least one second trench.

The present invention also comprises a method of forming such a partially manufactured semiconductor device and a semiconductor formed therefrom.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE EMBODIMENTS

Figure 1:
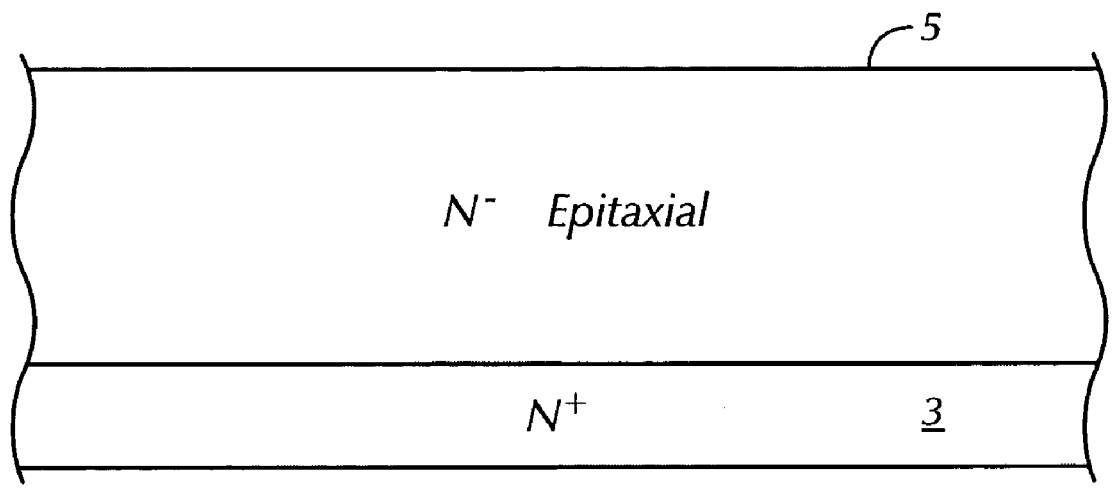
FIG. 1 is a partial sectional elevational view of a semiconductor substrate.

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a", as used in the claims and in the corresponding portions of the specification, means "at least one."

FIGS. 1–12 generally show a process for manufacturing a superjunction device utilizing overhangs to block ion implantation of the bottom of deep and wide trenches at the device edge terminations in accordance with a preferred embodiment of the present invention.

Referring to FIG. 1, there is shown a partial view of a semiconductor wafer that includes a heavily doped $N^+$ substrate 3 and a lightly doped $N^-$ layer 5. As used herein, reference to conductivity will be limited to the embodiment described. However, those skilled in the art know that p-type conductivity can be switched with N-type conductivity and the device would still be functionally correct (i.e., using a first or a second conductivity type). Therefore, where used herein, the reference to N or p can also mean that either N can be substituted for p or p can be substituted for N.

Figure 2:
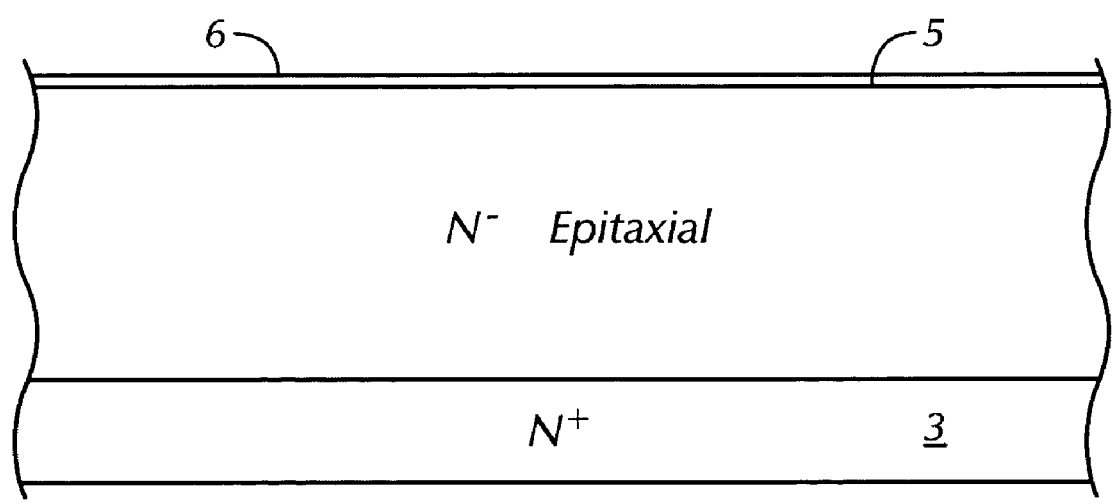
FIG. 2 is a partial sectional elevational view of the substrate of FIG. 1 after forming of an insulating layer.

Referring to FIG. 2, a layer of insulating material (first oxide layer) 6 is formed over the top of the $N^-$ layer 5 to a depth of about 0.2 to 5.0 micrometers or microns (µm). The method of application is selected from a group of processes including spun-on-glass (SOG), deposition, growth or a combination thereof. During later steps in the process, the insulating material or first oxide layer 6 prevents implantation of the $N^-$ areas underneath it.

Figure 3:
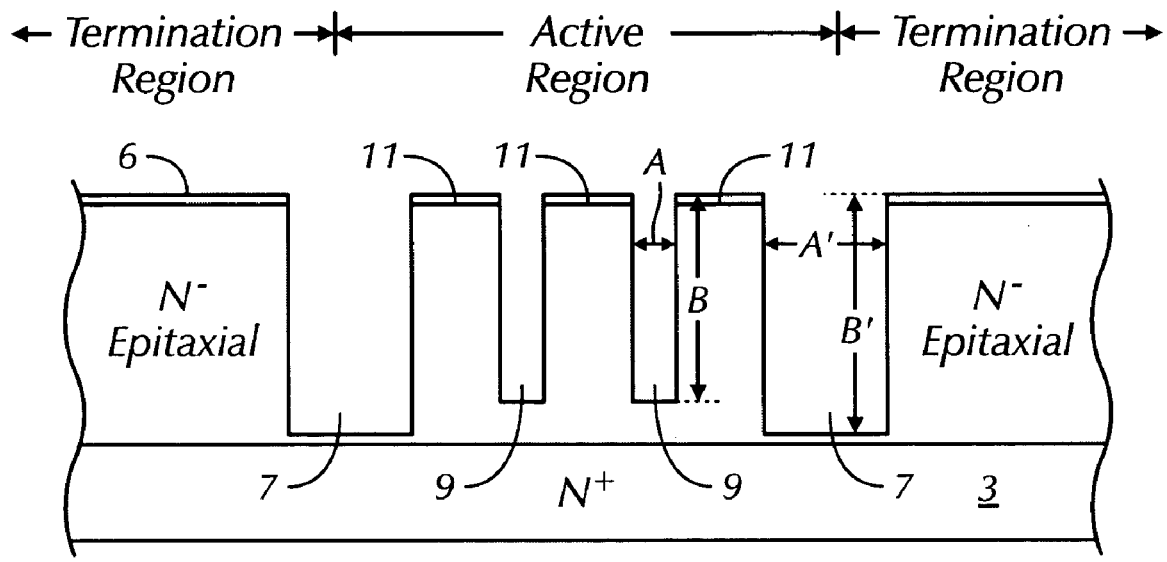
FIG. 3 is a partial sectional elevational view of the semiconductor substrate of FIG. 2 after an etch step.

Referring to FIG. 3, using techniques known in the art, the $N^-$ layer 5 is etched to create trenches 9, 7 and mesas 11 so that each bottom of one or more etched first trenches 9 approach(es) the interface between the $N^+$ substrate 3 and the $N^-$ layer 5 at a first depth B and each bottom of one or more etched second trenches 7 approach(es) the interface between the $N^+$ substrate 3 and the $N^-$ layer 5 at a second depth B'. The etch process creates a plurality of active region trenches 9 and a plurality of edge termination trenches 7. The trenches 9 and 7 thereby form mesas 11. The mesas 11 are referred to as device mesas because the mesas 11 are in an active region, as opposed to a surrounding termination or edge termination region. The active region is the area on which semiconductor devices will be formed, and the termination region is an area which provides insulation between cells of active devices. Thus, the second trenches 7 are positioned at a border between the active region and the edge termination region, and the first trenches 9 are located in the active region along with the mesas 11. The second trenches 7 provide an isolation region or gap between the active region and the edge termination region.

While the first trenches 9 extend from the first main surface of the epitaxial layer 5 toward the substrate (heavily doped region) 3 to the first depth position by depth B, the first trenches 9 do not necessarily extend all the way to the substrate (heavily doped region) 3. Likewise, while the second trenches 7 extend from the first main surface of the epitaxial layer 5 toward the substrate (heavily doped region) 3 to the second depth position by depth B', the second trenches 7 do not necessarily extend all the way to the substrate (heavily doped region) 3.

The second depth B' is greater than the first depth B, so the second trenches 7 are deeper than the first trenches 9. Likewise, the first trenches 9 each have a width A and the second trenches 7 each have a width A'. The second width A' is greater than the first width A, so the second trenches 7 are also wider than the first trenches 9.

Though not shown clearly, the first and second trenches 9, 7 are each preferably wider at their respective tops by about 1%–10% than at their respective bottoms to facilitate the trench fill process (described below). Thus, the mesas 11 have sidewall surfaces with a predetermined inclination maintained relative to a first main surface of the epitaxial layer 5.

Figure 4:
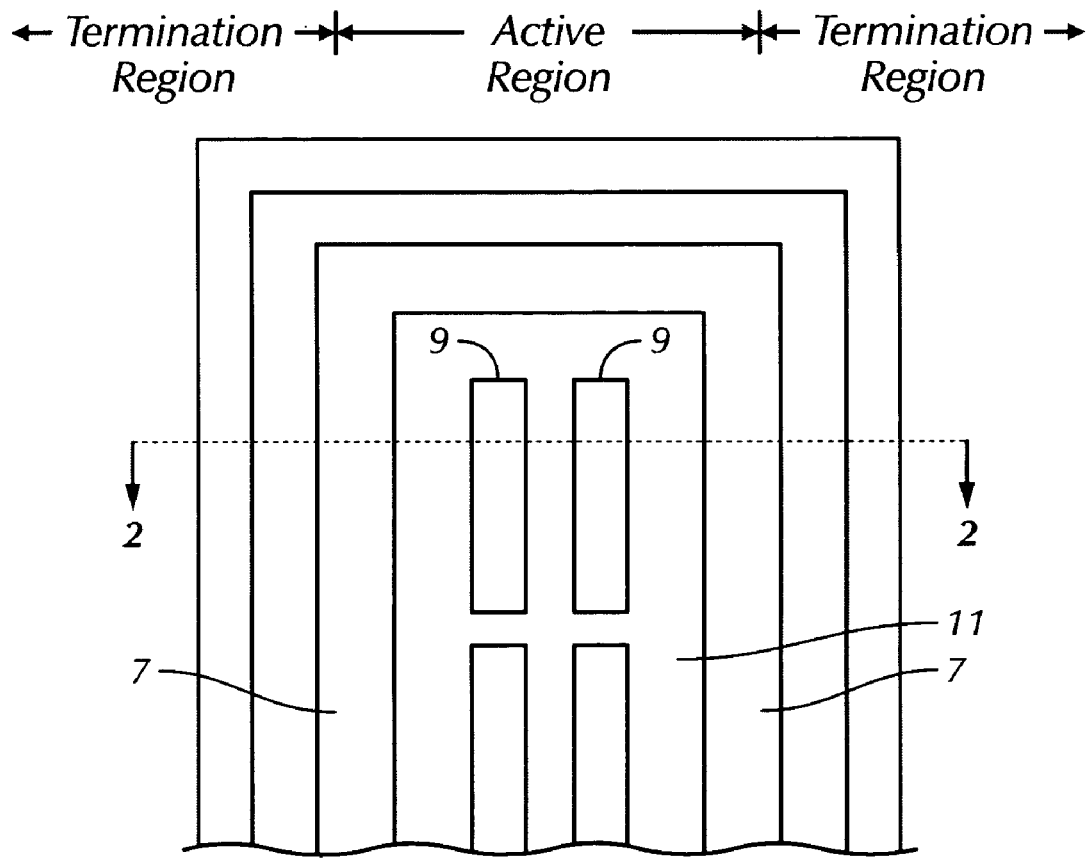
FIG. 4 is a top plan view of the substrate of FIG. 3.

FIG. 4 shows one of many possible top plan views of the substrate showing one contiguous second trench 7 surrounding a plurality of first trenches 9 and mesas 11 which are disposed in the active region. FIG. 4 also shows the locations of the active and termination regions. As shown, a plurality of first trenches 9 are disposed in a central region and form a plurality of mesas 11 with an outer surrounding second trench 7. As shown on FIGS. 3–4, the second trench 7 is wider and deeper than each of the first trenches 9. Many other geometrical arrangements of the first and second trenches 9, 7 and the mesas 11 are also contemplated without departing from the invention. For example, there may be multiple second trenches 7 in concentric relationship to each other or there may be discontinuities in the second trench 7 and the like.

Figure 5:
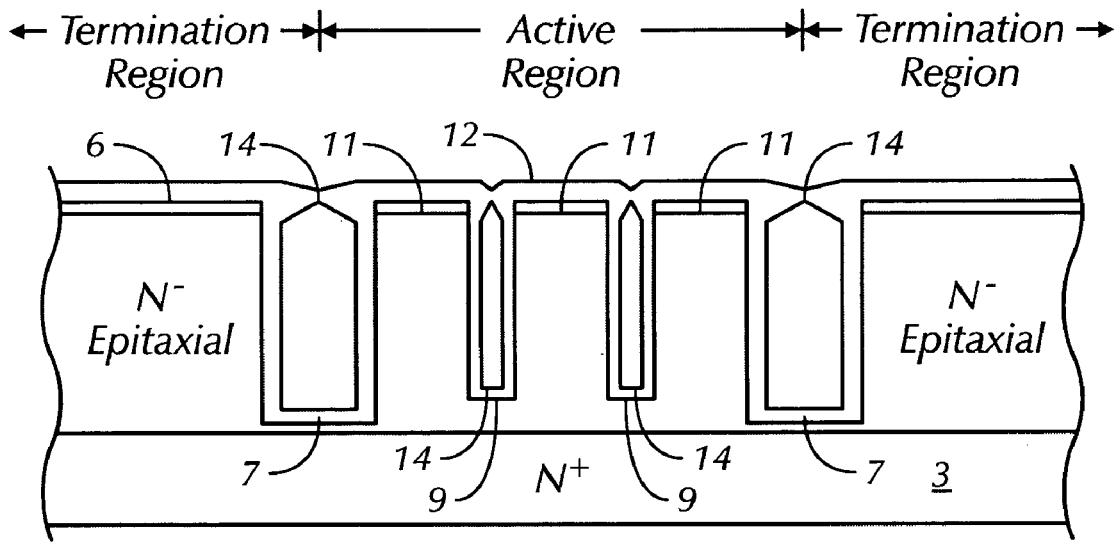
FIG. 5 is a partial sectional elevational view of the substrate of FIG. 3 after a deposition step is performed.

FIG. 5 shows a plurality of mesas 11 after a chemical vapor deposition (CVD) process covers the top of each mesa 11, each first trench 9 and each second trench 7 with a second layer of oxide 12 typically in the range of about 1–3 μm thick. When the top of each of the first and second trenches 9, 7 is sealed by the second oxide layer 12, voids 14 are formed within each of the first and second trenches 9, 7.

Figure 6:
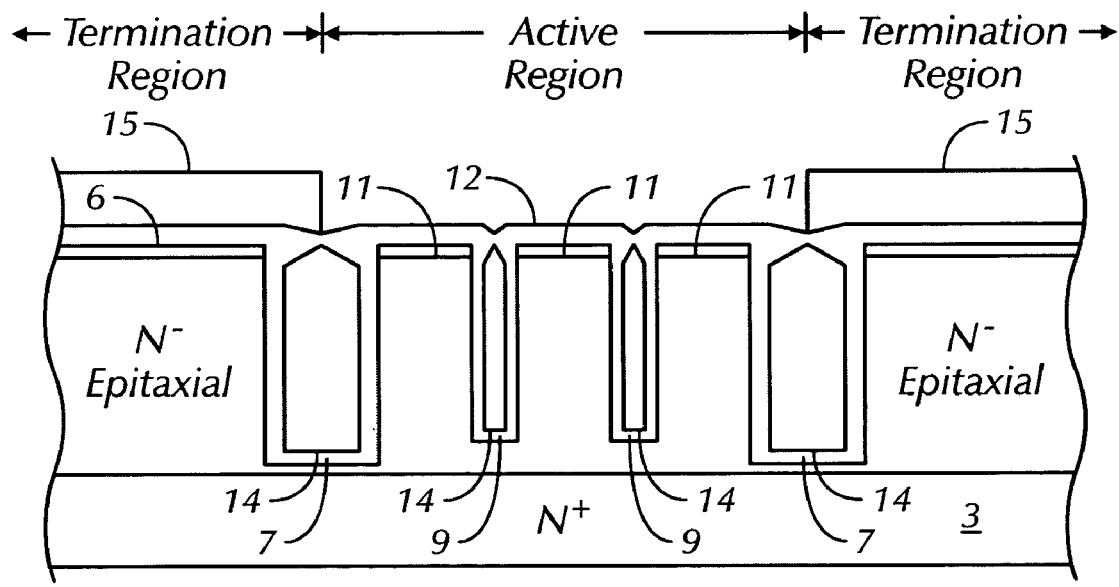
FIG. 6 is a partial sectional elevational view of the substrate of FIG. 5 after deposition of a masking layer.

FIG. 6 shows the structure of FIG. 5 after depositing an about 0.2–5.0 μm thick masking material 15, and then removing the layer 15 from over the active region to a point approximately over the center of the second (deep and wide) trenches 7 at the edge of the active regions. The masking material 15 may be a photoresist, a nitride, a metal, polysilicon or the like. The masking material 15 overlays a portion of the second trench 7.

Figure 7:
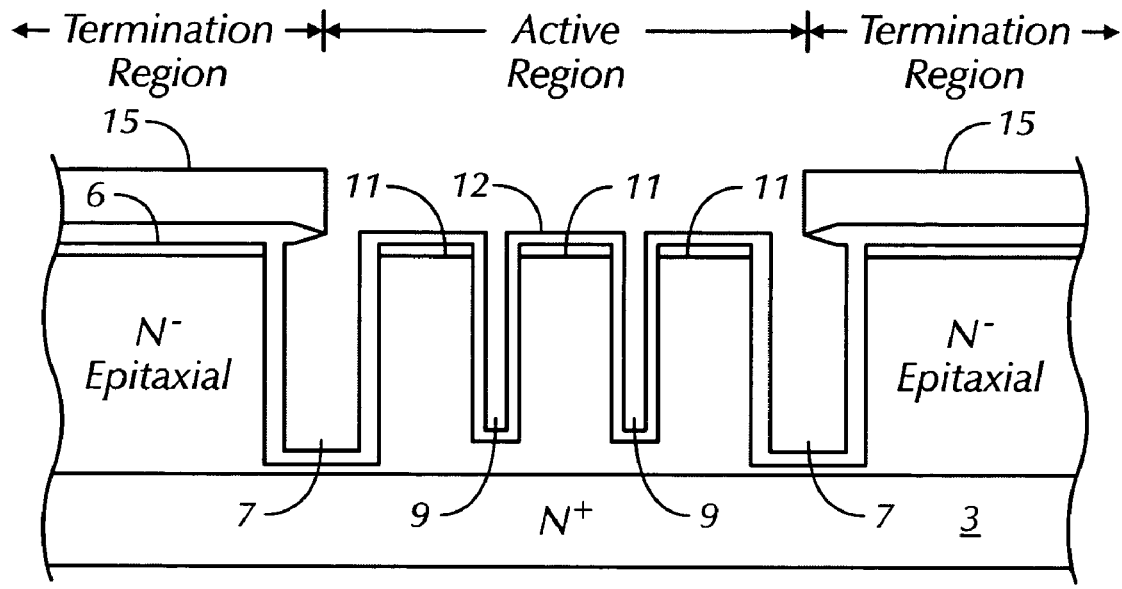
FIG. 7 is a partial sectional elevational view of the substrate of FIG. 6 after a dry etch step.

FIG. 7 shows the structure of FIG. 6 after a dry process oxide etch step has removed about 0.2–3.0 μm of the exposed oxide 12 which was deposited by the CVD process (FIG. 5), thereby opening the tops of the first trenches 9 in the active region and partially opening the top of the second (deep and wide) trenches 7 at the edge of the active region.

Figure 8:
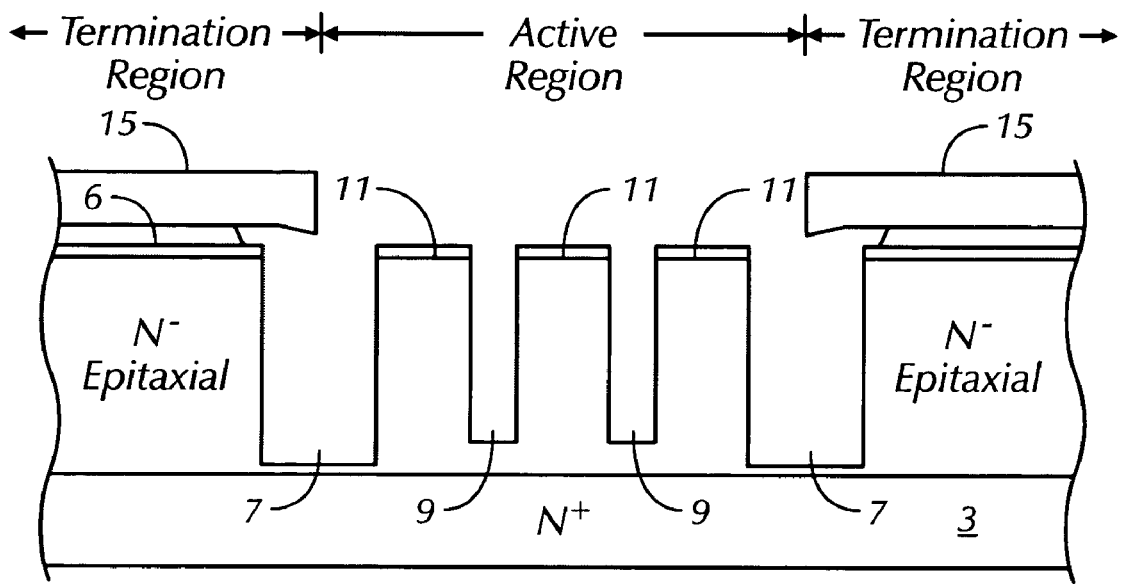
FIG. 8 is a partial sectional elevational view of the substrate of FIG. 7 after a wet etch step.

FIG. 8 shows the structure of FIG. 7 after a wet process oxide etch step has removed the remaining oxide 12 from the exposed mesas 11 and the first and second trenches 9, 7 in the areas not protected by the masking material 15. The oxide layer 6 remains and the masking material 15 hangs over a portion of the second trench 7.

Figure 9:
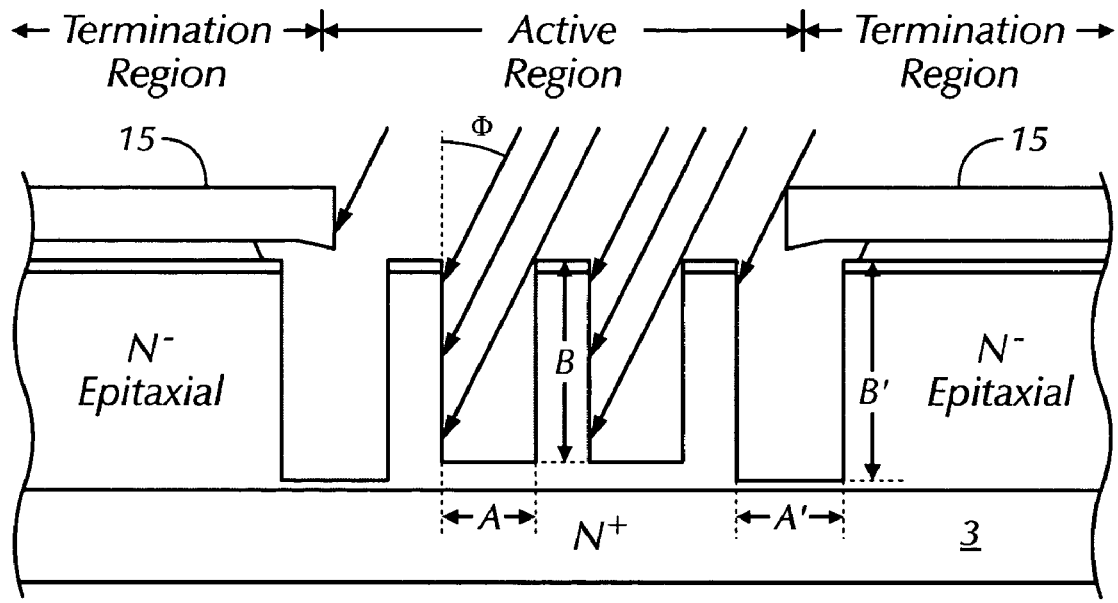
FIG. 9 is a partial sectional elevational view of the substrate of FIG. 8 showing an ion implant from a certain first angle.

FIG. 9 shows an ion implant in the structure of FIG. 8 from a first predetermined angle Φ (i.e., first predetermined angle of implant Φ). The first predetermined angle of implant Φ is determined by the width A and depth B of the first trenches 9, and is typically from about 2° to 12° from vertical. The use of the width A and depth B to determine the first predetermined angle of implant Φ ensures that only the sidewalls of the trenches 9, 7 in the active region will be implanted. Implantation of the bottom of any trench 9 or 7 would convert the substrate to a semiconductor, negating the capability of the structure for reverse voltage blocking. The implant is performed at an energy level typically in the range of about 20–200 kilo-electron-volts (KeV), implanting a dose in the range of about 1E10 to 1E14 cm$^{-2}$ (i.e., about $1 \times 10^{10}$ to $1 \times 10^{14}$ cm$^{-2}$) of N-type dopant. Consequently, a dopant of the first conductivity type is implanted, at a first predetermined angle of implant Φ, into at least one preselected mesa 11 to form at the sidewall surface of the one trench 9 a first doped region of the first conductivity type having a doping concentration lower than that of the heavily doped region.

Figure 10:
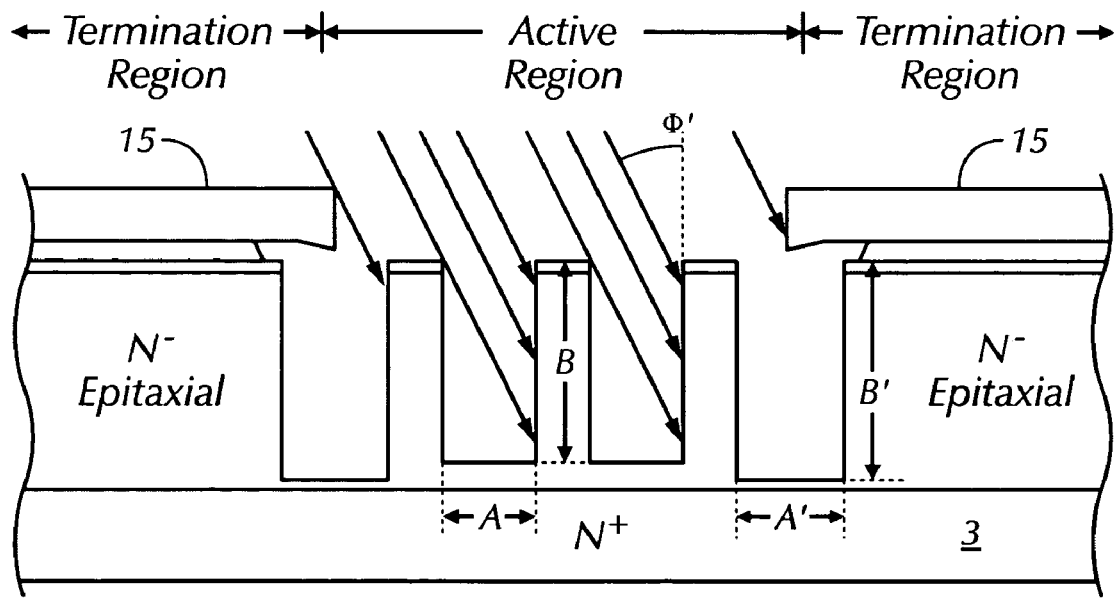
FIG. 10 is a partial sectional elevational view of the substrate of FIG. 9 showing an ion implant from a certain second angle.

FIG. 10 shows an ion implant in the structure of FIG. 9 from a second predetermined angle Φ' (i.e., second predetermined angle of implant Φ'). The second predetermined angle of implant Φ' is also determined by the width A and depth B of the first trenches 9, and is typically from about −2° to −12° from vertical. As in FIG. 9, the use of width A and depth B to determine the second predetermined angle of implant Φ' ensures that only the sidewalls of the trenches 9, 7 in the active region will be implanted. The implant is performed at an energy level typically in the range of about 20–200 KeV, implanting a dose in the range of about 1E10 to 1E14 cm$^{-2}$ of p-type dopant. Consequently, a dopant of the second conductivity type is implanted, at a second predetermined angle of implant Φ', into the at least one mesa 11, at a sidewall surface of the at least one mesa 11 opposite to the sidewall implanted with the dopant of the first conductivity type to provide a second doped region of the second conductivity type at the sidewall surface opposite to the sidewall implanted with the dopant of the first conductivity type, to form a P-N junction of the first and second doped regions located along the depth direction of at least one of the plurality of trenches 9 and to provide nonimplanted outer sidewalls of the active region.

Figure 11:
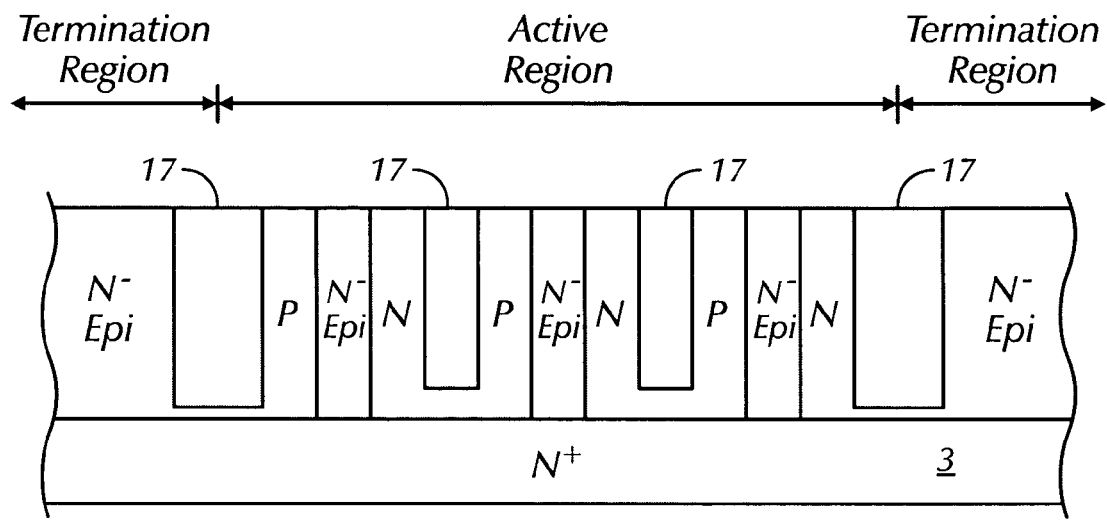
FIG. 11 is a partial sectional elevational view of the substrate of FIG. 10 after a trench fill and chemical mechanical polishing (CMP) step.

FIG. 11 shows the structure of FIG. 10 after the trenches have been refilled and a planarization process has been completed. The trenches are refilled with oxide 17, and a thin layer of dielectric material such as silicon nitride is deposited over the oxide 17 to avoid the problem of surface warping, which is inherent in oxide deposition. The structure is then planarized in a well known manner.

Preferably, the lateral dimension of each of the dopants of the first and second conductivity type regions in the top surface of the semiconductor device is greater than the distance from the sidewall surfaces of the adjacent pair of trenches 9 to the p-N junction of the first and second doped regions.

Figure 12:
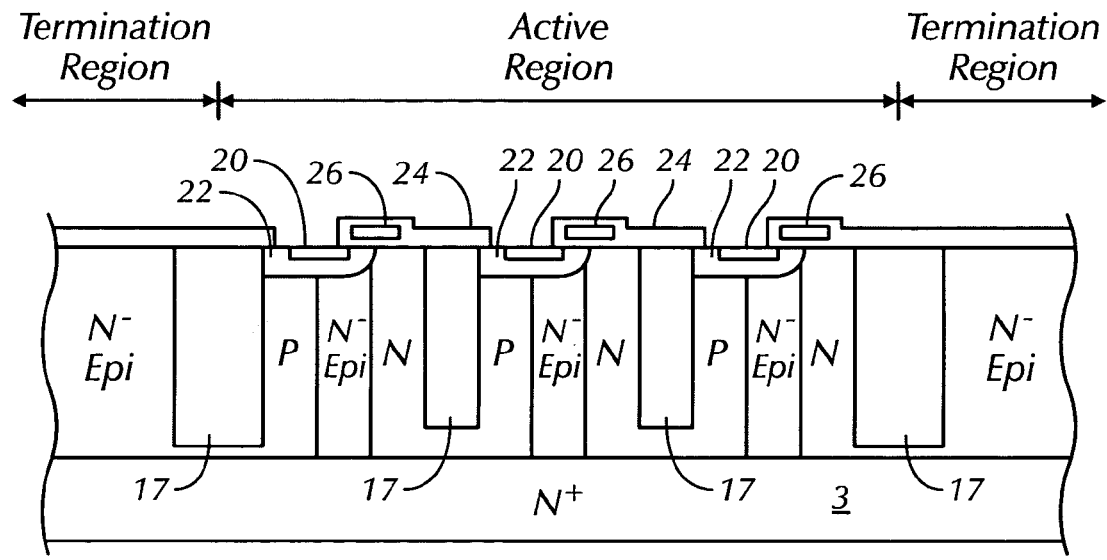
FIG. 12 is a partial sectional elevational view of the substrate of FIG. 11 after formation of a superjunction device thereon.

FIG. 12 shows the device of FIG. 11 with an implant of a p$^+$ body region 22, and an N$^+$ source region 20, that has been formed, after the trenches 7, 9 are filled with an insulating material 17, and the top surface is planarized. Manufacture of a superjunction device on the structure follows by performing an implant 22, depositing the gate 20 in the implanted region and adding the gate conductor 26 and gate oxide 24, all done using methods well known in the art. The formation of both of these regions 20, 22, and the following formation of gate dielectric 24 and the deposition and etching of the gate conductor 26 is well known. Hence, the gate electrode layer 20 is formed in at least one of the trenches 7, 9 and is formed on the first main surface. The gate electrode layer 20 is in ohmic contact with the first doped region. Preferably, the gate electrode layer 20 is in Schottky contact with the first doped region. The performance of devices built or formed on this structure have enhanced avalanche breakdown voltage ($V_b$) characteristics as compared to conventional semiconductor-transistor devices. The remainder of the steps that are required to form the metal-oxide semiconductor (MOS)-gated device are also well known. Thus, additional implants can also be provided such as by providing a third doped region of the second conductivity type at the first main surface of the first and second doped regions which are electrically connected to the second doped region and by providing a fourth doped region of the first conductivity type at at least one of the first main surface or a sidewall surface of the one trench 9 such that the fourth doped region is opposite to the first doped region with the third doped region posed therebetween. The gate electrode layer 20 is provided opposite to the third doped region between the first and fourth doped regions, with a gate insulation layer 24 interposed therebetween.

Thus, it can be seen that the preferred embodiments provide P-N junctions of the first and second doped regions located along the depth direction of the plurality of trenches 9. The fabrication of conventional metal-oxide semiconductor field effect transistor (MOSFET) device(s) on the active region can then take place using well known steps.

From the foregoing, it can be seen that the present invention is directed to a method for manufacturing a semiconductor device, a partially manufactured semiconductor device and a semiconductor device utilizing overhangs to block ion implantation of the bottom of deep and wide trenches at the device edge terminations, thereby enhancing the voltage blocking capability of the device terminations. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A partially manufactured semiconductor device comprising:
    a semiconductor substrate having first and second main surfaces opposite to each other, the semiconductor substrate having a heavily doped region of a first conductivity type at the second main surface and having a lightly doped region of the first conductivity type at the first main surface;
    a first oxide layer formed over the first main surface with a mask placed over the oxide-covered substrate, a plurality of first trenches and at least one second trench being etched through the oxide layer into the semiconductor substrate through openings in the mask forming mesas, each first trench having a first extending portion extending from the first main surface toward the heavily doped region to a first depth position relative to the first main surface, the at least one second trench having a second extending portion extending from the first main surface toward the heavily doped region to a second depth position relative to the first main surface, each mesa having a sidewall surface, each of the plurality first trenches and the at least one second trench being separated from adjacent trenches by one of the mesas, the at least one second trench being deeper and wider than each of the plurality of first trenches;
    a second oxide layer formed over an area of mesas and the plurality of first trenches, the second oxide layer covering the top of each mesa and sealing the top of each of the plurality of first trenches and the at least one second trench at an edge of the area containing the mesas and the plurality of first trenches;
    a layer of masking material selected from a group including a photoresist, a nitride, a metal, and polysilicon, deposited over a preselected area of an edge termination region adjacent to an active region containing at least the area of mesas and the plurality of first trenches, and partially over the at least one second trench at an edge of the area of the active region containing the mesas and the plurality of first trenches, the edge termination region containing a portion of the at least one second trench, the active region being the area on which a semiconductor device will be formed and the termination region being an area which provides insulation between cells of semiconductor devices;
    the area of mesas and the plurality of first trenches not covered by the masking layer having the oxidant seal removed over the plurality of trenches including the at least one second trench;
    an overhang area that includes the masking material and that is formed by a wet process etch which removes areas of the oxide layer not protected by the masking material, the overhang area extending partially over the at least one second trench; and
    implanted areas, including the sidewalls of each trench in the active region, which form P-N junctions along the first depth direction of each of the plurality of first trenches and part of the at least one second trench along the second depth direction.

2. A partially manufactured semiconductor device according to claim 1, further comprising:
    an insulating material filling the plurality of first trenches disposed in the active region and the at least one second trench disposed at least partially in the edge termination region; and
    a planarized top surface.

3. A semiconductor device comprising:
    a semiconductor substrate having first and second main surfaces opposite to each other, the semiconductor substrate having a heavily doped region of a first conductivity type at the second main surface and having a lightly doped region of the first conductivity type at the first main surface;
    a first oxide layer formed over the first main surface with a mask placed over the oxide-covered substrate, a plurality of first trenches and at least one second trench being etched through the oxide layer into the semiconductor substrate through openings in the mask forming mesas, each first trench having a first extending portion extending from the first main surface toward the heavily doped region to a first depth position relative to the first main surface, the at least one second trench having a second extending portion extending from the first main surface toward the heavily doped region to a second depth position relative to the first main surface, each mesa having a sidewall surface, each of the plurality first trenches and the at least one second trench being separated from adjacent trenches by one of the mesas, the at least one second trench being deeper and wider than each of the plurality of first trenches;
    a second oxide layer formed over an area of mesas and the plurality of first trenches, the second oxide layer covering the top of each mesa and sealing the top of each of the plurality of first trenches and the at least one second trench at an edge of the area containing the mesas and the plurality of first trenches;
    a layer of masking material selected from a group including a photoresist, a nitride, a metal, and polysilicon, deposited over a preselected area of an edge termination region adjacent to an active region containing at least the area of mesas and the plurality of first trenches and partially over the at least one second trench at an edge of the area of the active region containing the mesas and the plurality of first trenches, the edge termination region containing a portion of the at least one second trench;

the area of mesas and the plurality of first trenches not covered by the masking layer having the oxidant seal removed over the plurality of trenches including the at least one second trench;

an overhang area that includes the masking material and that is formed by a wet process etch which removes areas of the oxide layer not protected by the masking material, the overhang area extending partially over the at least one second trench;

implanted areas, included the sidewalls of each trench in the active region, which form P-N junctions along the first depth direction of each of the plurality of first trenches and part of the at least one second trench along the second depth direction;

an insulating material filling the plurality of first trenches disposed in the active region and the at least one second trench disposed in the edge termination region;

a planarized top surface; and a superjunction device formed on the device, the active region being the area on which the superjunction device is formed and the termination region being an area which provides insulation between cells of superjunction devices.

4. The partially manufactured semiconductor device according to claim 1, wherein the sidewall surface of each mesa has a predetermined inclination angle maintained relative to the first main surface.

5. The semiconductor device according to claim 3, wherein the sidewall surface of each mesa has a predetermined inclination angle maintained relative to the first main surface.

* * * * *